United States Patent [19]

Horiuchi

[11] Patent Number: 4,471,234

[45] Date of Patent: Sep. 11, 1984

[54] SWITCH CIRCUIT

[75] Inventor: Tatsumi Horiuchi, Hachioji, Japan

[73] Assignee: Konishiroku Photo Industry Co., Ltd., Tokyo, Japan

[21] Appl. No.: 310,476

[22] Filed: Oct. 13, 1981

[30] Foreign Application Priority Data

Oct. 26, 1980 [JP] Japan ................. 55-149699

[51] Int. Cl.³ ................. H01H 19/64; H01H 47/00
[52] U.S. Cl. ................. 307/113; 355/3 SH; 355/14 SH
[58] Field of Search ......... 307/113; 355/3 SH, 14 SH

[56] References Cited

U.S. PATENT DOCUMENTS 3,371,254 10/1965 Hagfors ................. 307/113
3,375,435 3/1966 Baugher ................. 307/113
4,190,246 2/1980 Sasuga ................. 355/14 SH Primary Examiner—E. A. Goldberg
Assistant Examiner—Derek Jennings
Attorney, Agent, or Firm—Jordan B. Bierman; Linda Bierman

[57] ABSTRACT

A circuit for indicating the current or existing composite operating states of a plurality of switches switchable between open and closed states, and all normally disposed in a first of those states, includes a resistance of predetermined value for and connected to each switch, and connections between all of the switch-resistance combinations to form a switch assembly which outputs a total resistance uniquely defined in accordance with the particular existing open and closed states of the plural switches. A constant current source supplies a constant current to the switch assembly so that the assembly outputs a voltage in accordance with the unique resistance, and a voltage discriminator receives the voltage output and generates a corresponding output indicative of the existing operating states of the switches.

1 Claim, 2 Drawing Figures

FIG. I

SWITCH CIRCUIT

BACKGROUND OF THE INVENTION

1. Field of the Invention

The present invention relates to a switch circuit having plural points of contact and providing a signal to discriminate the operation state of each point of contact and, more particularly, to a switch circuit that is suitable to detect the size of the transfer paper in the paper feed cassette attached to the main body of the copying apparatus.

2. Description of the Prior Art

FIG. 1 is an electric circuit diagram of a conventional switch circuit for discriminating the size of the transfer paper in a copying apparatus. In FIG. 1, S11, S21, S31, S41, S51 and S61 are the switches attached to the main body side of the apparatus, S11 through S51 are the switches to detect the size of the transfer paper and, S61 is a switch to detect the existence of the transfer paper. It is so constituted that one of the switches S11–S51 is closed by the protrusion provided on each paper feeding cassette corresponding to the size of the transfer paper when the paper feeding cassette is inserted, and the switch S61 is closed when transfer paper is present. CO is a connector, IP is an input terminal and CC is a control circuit. Switches S11–S61 are connected to the input terminal IP through the connector CO and the signal therefrom is inputted to the control circuit CC. Symbols 10, 11, 12, 13, 14, 15 and 16 are lead wires that connect one side of the connector CO to switches S11–S61. Symbols 10', 11', 12', 13', 14', 15' and 16' are lead wires that connect the other side of the connector CO to the input terminal IP. In each lead wire, the one having the same suffix in its symbol is electrically connected through the connector CO to the other lead. A closed circuit consisting of lead wires 10', 10, 11' and 11 and switch S11 is formed when the switch S11 is closed; a closed circuit consisting of lead wires 10', 10, 12' and 12 and switch S21 is formed when the switch S21 is closed; a closed circuit consisting of lead wires 10', 10, 13' and 13 and switch S31 is formed when the switch S31 is closed; a closed circuit consisting of lead wires 10', 10, 14 and 14' and switch S41 is formed when the switch S41 is closed; a closed circuit consisting of lead wires 10', 10, 15 and 15' and switch S51 is formed when the switch S51 is closed; and a closed circuit consisting of lead wires 10', 10, 16 and 16' and switch S61 is formed when the switch S61 is closed. Symbols L1, L2, L3, L4, L5 and L6 are luminous elements that indicate the size of the transfer paper and are arranged on the indicator part of the main body of the apparatus. These luminous elements L1–L6 are connected to the control circuit CC through the output terminal OP. The luminous element L1 is operated by the control circuit CC when the switch S11 is closed and it indicates the size of the transfer paper contained in the paper feeding cassette that has closed the switch S11. In the same manner, the luminous element L2 is operated by the control circuit CC when the switch S21 is closed, the luminous element L3 is operated by the control circuit CC when the switch S31 is closed, the luminous element L4 is operated by the control circuit CC when the switch S41 is closed, the luminous element L5 is operated by the control circuit CC when the switch S51 is closed and the luminous element L6 is operated by the control circuit CC when the switch S61 is closed. Thus the size of the transfer paper in the paper feeding cassette or the existence of the transfer paper therein is indicated.

In the conventional switch circuit, there has been a problem that lead wires in the quantity corresponding to the number of switches, the connector CO having pins in the quantity corresponding to the number of switches and the input terminal IP and the output terminal OP both having terminals in the quantity corresponding to the number of switches are needed and therefore, the wiring is complicated and the reliability is lowered accordingly. Also, there has been a problem that actual installation of the connector having many pins and the input/output terminals having many terminals have caused the cost to be high.

SUMMARY OF THE INVENTION

The present invention has been devised to solve such problems and its object is to offer a switch circuit with which it is possible to attain a cost reduction and a reliability improvement by reducing the number of wires in the switch circuit and by using a connector with less number of pins.

According to one aspect of the invention there is provided a switch circuit comprising a switch assembly which has plural switching parts, constant current source that supplies constant electric current to the switch assembly and a voltage discriminator whose input is an output signal of the switch assembly, wherein each switching part comprises a resistor and a switch connected to each other.

DESCRIPTION OF THE PREFERRED EMBODIMENTS

Figure 1:
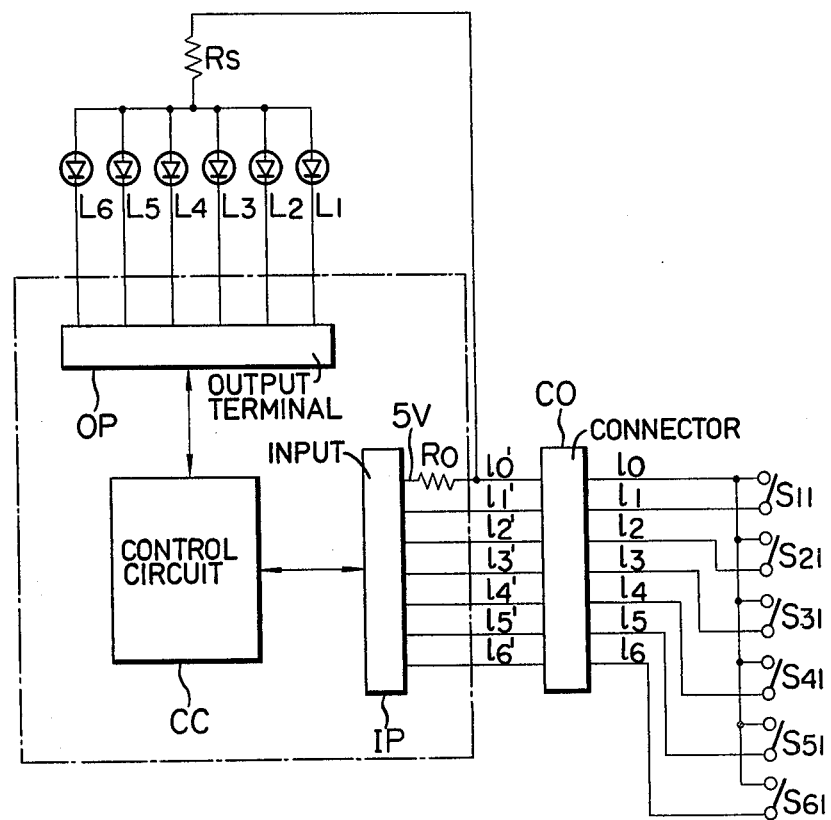
FIG. 1 shows an electric circuit diagram of the switch circuit in a coventional copying apparatus and FIG. 2 is an electric circuit diagram showing an example of the switch circuit related to the present invention.

Referring to the drawings, the present invention will be described in detail as follows.

Figure 2:
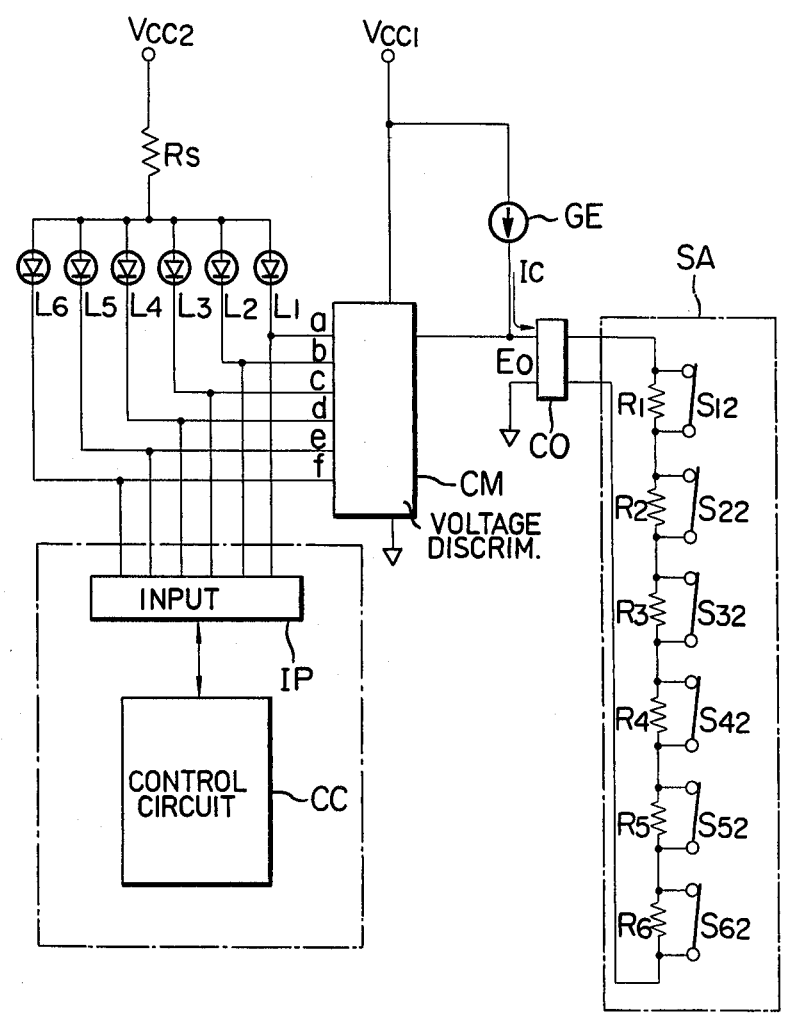

FIG. 2 is an example of the switch circuit related to the present invention and it represents the electric circuit diagram of a switch circuit for a copying apparatus. In FIG. 2, SA is a switch assembly and this switch assembly is composed of switches S12–S62 such as a microswitch or the like and resistors R1–R6 connected between the points of contact of these switches S12–S62. In other words, the switch assembly comprises plural switching parts connected in series, wherein each switching part consists of a switch and a resistor connected to the switch in parallel. Switches S12, S22, S32, S42 and S52 are provided to detect the size of the transfer paper and are to be opened or closed by the protrusions arranged on each paper feeding cassette containing the transfer paper corresponding to the size of the transfer paper. And it is so devised that any one of the switches is opened corresponding to the size of the transfer paper when the paper feeding cassette is inserted. For example, the switch S12 is opened for the size A5, and the switch S22 for the size B5, the switch S32 for the size A4, the switch S42 for the size B4 and the switch S52 for the size A3 are opened respectively. Meanwhile, the switch S62 is devised to be opened when there is no transfer paper in the paper feeding cassette. The Aforesaid resistors R1–R6 are connected between each point of contact of these switches S12–S62 respectively. Namely, R1 is connected to the switch S12, R2 is connected to the switch S22, R3 is connected to the switch S32, R4 is connected to the switch S42, R5 is connected to the switch S52 and R6 is connected to the switch S62 respectively. Incidentally, the values of the resistors R1–R6 are graded and, for example, the selection is made so that R1 is 100Ω, R2 is 200Ω, R3 is 300Ω, R4 is 400Ω, R5 is 500Ω and R6 is 600Ω.

CO is a connector, GE is a constant current source and CM is a voltage discriminator. A switch assembly SA is connected to the constant current source GE and to the voltage discriminator CM through the connector CO. The constant current source GE and the voltage discriminator CM are driven by a driving power source Vcc1 and constant current Ic (e.g., 10mADC) is supplied from the constant current source GE to the switch assembly SA. The input of the voltage discriminator CM is the output voltage Eo of the switch assembly SA. Inside of this voltage discriminator CM, the standard voltage is classified into zones such as 0.6–1.4 V (this range is called A zone, and so forth), 1.6–2.4 V (B zone), 2.6–3.4 V (C zone), 3.6–4.4 V (D zone), 4.6–5.4 V (E zone) and over 5.6 V (F zone), for example. The voltage discriminator CM discriminates the zone to which the volatage Eo belongs and then the terminal a for A zone, the terminal b for B zone, the terminal c for C zone, the termianl d for D zone, the terminal e for E zone or the terminal f for F zone is connected to the common line corresponding to the discriminated zone.

L1, L2, L3, L4, L5 and L6 are light-emitting elements, IP is an input terminal and CC is a control circuit. Light-emitting elements L1–L6 are connected to the driving power source Vcc2 through the resistor Rs. Terminals on the light-emitting elements L1–L6 opposing the aforesaid resistor Rs are connected to the terminals a–f of the voltage discriminator CM and to the input terminal IP. Namely, the light-emitting element L1 is connected to the terminal a, the light-emitting element L2 is connected to the terminal b, the light-emigging element L3 is connected to the terminal c, the light-emitting element L4 is connected to the terminal d, the light-emitting element L5 is connected to the terminal e and the light-emitting element L6 is connected to the terminal f respectively.

Next, the operation of the switch circuit having the aforesaid constitution will be explained using the aforesaid values.

When the paper feeding cassette containing A4 size transfer paper therein is inserted into the main body of the apparatus, the switch S32 is opened and other switches are closed and therefore the output Eo of the switch assembly SA is as follows, $$Eo = R3 \times Ic = 300 \times 10 \times 10^{-3} = 3 \text{ V}$$

and this is an input to the voltage discriminator CM. Since 3 V corresponds to the C zone, the terminal c is guided to the common line by the voltage discriminator CM. Therefore, an electric current is supplied from the driving power source Vcc2 to the light-emitting element L3 through the resistor Rs, which causes the light-emitting element L3 to be in the light-emitting state and thus it is indicated that the A4 size transfer papers are loaded. In the control circuit CC, on the other hand, it is detected that the terminal c is connected and with this signal, the sequence control of the copying apparatus is made as the circumstances require. Further, when the paper feeding cassette containing the transfer paper other than A4 size one, the transfer paper of A5 size, for example, is inserted into the main body of the apparatus, the switch S12 is opened and an input voltage to the voltage discriminator CM will be 1 V. Therefore, the terminal a is connected to the common line on the voltage discriminator CM and the light-emitting element L1 emits the light and thus it is indicated that the transfer papers of A5 size are loaded.

In this manner, for all cases that the paper feeding cassette containing any size of transfer paper is inserted into the main body of the apparatus, the switch corresponding to the size of the transfer paper is opened and thereby the voltage with specified magnitude is given as an input voltage of the voltage discriminator CM. And, the light-emitting element corresponding to the voltage value, namely, the light-emitting element corresponding to the switch in the state of open is driven and the size of the transfer paper loaded in the apparatus is indicated automatically.

When there is no transfer paper in the paper feeding cassette, on the other hand, the switch S62 is opened and the output Eo of the switch assembly SA is as follows, $$E0 = (Ri + 600) \times 10 \times 10^{-3} \text{ V (where, } i=1, 2, 3, 4 \text{ or } 5)$$

and the voltage that is more than 6 V is inputted to the voltage discriminator CM. This voltage corresponds to the F zone and therefore, the terminal f is connected to the common line, the light-emitting element L6 is driven and it is indicated that there is no transfer paper in the paper feeding cassette.

The following table represents a summary of the aforesaid example.

| Transfer paper size | Switch to be opened | Value of foltage Eo (V) | Terminal to be connected to common line | Light-emitting element to be driven |
|---|---|---|---|---|
| A5 | S12 | 1 | a | L1 |
| B5 | S22 | 2 | b | L2 |
| A4 | S32 | 3 | c | L3 |
| B4 | S42 | 4 | d | L4 |
| A3 | S52 | 5 | e | L5 |
| No paper | S62 | Over 6 | f | L6 |

Incidentally, use of the element with points of contact for switches S12–S62 is shown in the aforesaid example, but the present invention is not limited thereto and the element without points of contact can naturally be used. A further embodiment wherein the point of contact is normally opened is possible though the one wherein the point of contact for switches S12–S62 is normally closed is shown. Like it is also possible to arrange the switch assembly like that it comprises plural switching parts connected in parallel and each switching part consists of a switch and a resistor connected to the switch in series.

As explained above, in the switch circuit of the present invention, the number of wires in the wiring in the switch circuit is fewer and thereby the adoption of the connector with less pins is possible. The switch assembly consists of plural switching parts wherein the resistor is connected to the switch (terminal or the like) and the output of the switch assembly is discriminated by the voltage categorized and thus the proper element is driven. Thereby, it is possible to realize the cost reduction and the improvement in the reliability.

What is claimed is:

1. A circuit for indicating the existing operating condition of a device, comprising:

a plurality of switch means switchable between open and closed states, all of said switch means being normally disposed in a first of said states;

a resistance of predetermined value for and connected to each of said switch means, each said resistance being connected in parallel with a respective one of said switch means, and said switch means being interconnected in series circuit arrangement;

said plural switch means and connected resistors being interconnected to form a switch assembly having a two lead output across which leads a composite resistance is uniquely defined in accordance with the particular existing open and closed states of said plural switch means, said particular existing open and closed states of said plural switch means defining an existing operating condition of a device;

source means for supplying a constant current to said switch assembly so that said assembly outputs a voltage in accordance with said unique resistance and the constant current supplied thereto; and a voltage discriminator for receiving the output voltage of said switch assembly and for generating at least one output in accordance therewith indicative of the existing operating condition of the device.

* * * * *